United States Patent [19]
Cunningham et al.

[11] Patent Number: 5,510,277
[45] Date of Patent: Apr. 23, 1996

[54] SURFACE TREATMENT FOR SILICON SUBSTRATES

[75] Inventors: John E. Cunningham, Lincroft; Keith W. Goossen, Aberdeen; William Y. Jan, Scotch Plains; James A. Walker, Howell, all of N.J.

[73] Assignee: AT&T Corp., Murray Hill, N.J.

[21] Appl. No.: 268,137

[22] Filed: Jun. 29, 1994

[51] Int. Cl.$^6$ .................................................. H01L 21/302
[52] U.S. Cl. .......................... 437/24; 437/946; 437/937; 156/643.1
[58] Field of Search .......................... 437/24, 110, 133, 437/937, 946, 228; 156/643.1

[56] References Cited

U.S. PATENT DOCUMENTS

| | | | |
|---|---|---|---|
| 5,089,441 | 2/1992 | Moslehi | 437/946 |
| 5,093,695 | 3/1992 | Cunningham et al. | 357/15 |
| 5,308,791 | 5/1994 | Horiike et al. | 437/946 |
| 5,310,697 | 5/1994 | Kan et al. | 637/937 |
| 5,328,558 | 7/1994 | Kawamura | 437/946 |
| 5,348,912 | 9/1994 | Choquette et al. | 437/133 |

FOREIGN PATENT DOCUMENTS

| | | | |
|---|---|---|---|
| 4336426 | 11/1992 | Japan | 437/937 |

OTHER PUBLICATIONS

"Low dislocation density GaAs on Si heteroepitaxy with atomic hydrogen irradiation for optoelectronic integration," Okada et al., *Journal Of Applied Physics*, vol. 73, No. 11, 1 Jun. 1993, pp. 7376–7384.

"Growth of Pseudomorphic $In_xGa_{1-x}As/GaP_yAs_{1-y}$ multiple quantum well structures on GaAs by gas source molecular beam epitaxy," J. E. Cunningham et al., *Journal of Crystal Growth*, 127 (1993) pp. 184–188.

"monolithic Integration of GaAs/AlGaAs Multiple Quantum Well Modulators and Silicon Metal–Oxide—Semiconductor Transistors," K. W. Goossen et al. *OSA Proceedings on Photonics In Switching*, 1993, vol. 16, pp. 94–98.

"30 GΩ Isolation of GaAs Devices on Doped Si Via Undoped Buffer–Layers Application to Symmetric Self-–Electrooptic Effect Devices," K. W. Goossen et al., *IEEE Photonics Technology Letters*, vol. 4, No. 7, Jul. 1992, pp. 763–765.

"Excitonic electroabsorption in extremely shallow quantum wells," K. W. Goossen et al., *Applied Physics Letters*, vol. 57, No. 24, 10 Dec., 1990, pp. 2582–2584.

"Low–Temperature Cleaning os Si and Growth of GaAs on Si By Hydrogen Plasma–Assisted Metalorganic Molecular-–Beam Epitaxy," Y. Kunitsugu et al., *Journal of Crystal Growth*, vol. 95 (1989), pp. 91–95.

"New Low–temperature process for growth of GaAs on Si with Metal–organic molecular beam expitaxy assisted by a hydrogen plasma," I. Suemune et al., *Applied Physics Letters*, vol. 53, No. 22, 28 Nov. 1988, pp. 2173–2175.

"Persistent Channel Depletion Cuased by Hot Electron Trapping Effect in Selectively Doped n–AlGaAs/GaAs Structures," Kinoshita et al., *Japanese Journal of Applied Physics*, Part 1, vol. 24, No. 3 Mar. 1985, pp. 377–378.

"Molecular beam epitaxial growth and material properties of GaAs and AlGaAs on Si (100)," W. I. Wang, *Applied Physics Letters*, vol. 44, No. 12, 15 Jun. 1984, pp. 1149–1151.

"Leed Study Of The Stepped Surface Of Vicinal Si (100)," R. Kaplan, *Surface Science*, vol. 93, 1980, pp. 145–158.

*Primary Examiner*—George Fourson
*Assistant Examiner*—S. Mulpuri
*Attorney, Agent, or Firm*—Stuart H. Mayer

[57] ABSTRACT

A method for desorbing the surface oxide on a silicon substrate is performed by implanting particles such at atomic or ionic hydrogen into the oxide layer on the silicon substrate. The oxide is then removed by breaking the bonds between the silicon and oxygen atoms within the oxide. The bonds may be broken by heating the substrate, for example. The temperature to which the substrate must be raised is substantially less than the temperature required to desorb an oxide layer that has not undergone an implantation step. In one particular example, the particles implanted into the oxide surface are hydrogen ions generated by electron cyclotron resonance.

16 Claims, 6 Drawing Sheets

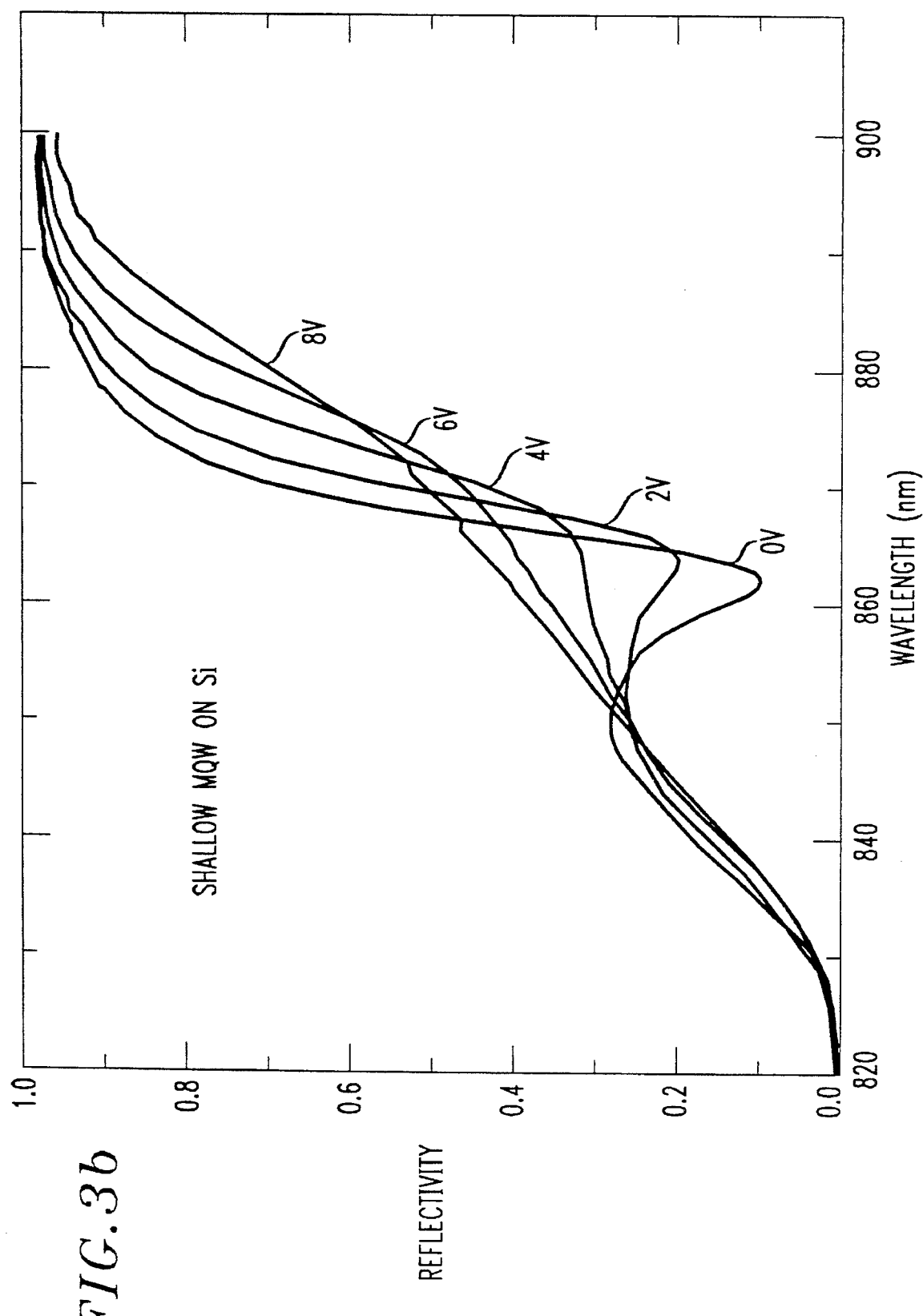

SURFACE TREATMENT FOR SILICON SUBSTRATES

FIELD OF THE INVENTION

This invention relates to a method for preparing a silicon substrate. More particularly this invention relates to a method for desorbing the surface oxide on a silicon substrate in preparation for the subsequent heteroepitaxial growth of GaAs.

BACKGROUND OF THE INVENTION

The use of optical interconnects for silicon integrated circuits has been employed heretofore to take advantage of the greater capacity of optoelectronics for communications while retaining the computational advantages of silicon electronics. For example, as disclosed in K. W. Goossen et al., "Photonics in Switching Technical Digest," Palm Springs, Calif. 1993 p. 50, GaAs multiple quantum well (MQW) light modulators have been successfully grown directly on silicon and subsequently interconnected electrically to pre-existing silicon integrated circuits. This development has the potential to open up two new important technological applications for III-V photonics. First, the integration of the GaAs light modulators on silicon can form the basis of a smart pixel element, which when fabricated into large arrays are capable of processing huge amounts of information in parallel at terabit speeds for photonic switching. Second, a GaAs light modulator on silicon also may be employed to alleviate input-output bottle necks to high density integrated circuits by means of free space interchip optical communication.

An important issue in the heteroepitaxial growth of III-V compounds such as GaAs on a silicon substrate is the preparation of the silicon surface. For example, native silicon oxides on the surface must be removed prior to growth. It is known that these oxides can be desorbed by heating the substrate in ultrahigh vacuum at a temperature of 825°–900° C. However, this temperature is too high for the successful fabrication of silicon-based integrated circuits since desorption in this temperature range causes the substrate to absorb too much heat. In fact, the amount of heat absorbed is comparable to the total thermal budget of the processing steps typically employed to produce such integrated circuits. Accordingly, desorption at these elevated temperatures will likely produce a low yield of silicon-based integrated circuits.

Another known desorption method involves the application of hydrogen plasma to the silicon surface by a technique such as electron cyclotron resonance (ECR). In this method the plasma etches the silicon surface and the process is continued until all of the oxide layers are removed and a clean silicon surface remains. An example of such an etching process is disclosed in Y. Kunitsugu et al., J. Crystal Growth, 95, 91 (1989). However, this known desorption method has a deleterious effect on the quality of the silicon surface which adversely effects III-V heteroepitaxial growth. In particular, it has been shown that high quality epitaxial growth of GaAs on silicon requires a silicon surface that has a high degree of bilayer step ordering. The plasma etching process reduces this ordering and produces faceting on the exposed silicon surface.

SUMMARY OF THE INVENTION

In accordance with this invention, desorption is accomplished by implanting particles such as atomic or ionic hydrogen into the oxide layer on the silicon substrate. The oxide is then removed by breaking the bonds between the silicon and oxygen atoms within the oxide. The bonds may be broken by heating the substrate, for example. The temperature to which the substrate must be raised is less than the temperature required to desorb an oxide layer that has not undergone an implantation step. In one particular example of the invention, the particles implanted into the oxide surface are hydrogen ions generated by electron cyclotron resonance. Accordingly, the method of this invention desorbs a silicon surface of its native oxide layer below a temperature of approximately 825° C. while preserving the bilayer step ordering of the surface.

BRIEF DESCRIPTION OF THE DRAWINGS

FIG. 3(a) shows the photocurrent as a function of wavelength for a MQW modulator grown on a silicon surface that was not miscut and FIG. 3(b) shows the photocurrent for a modulator grown on a silicon surface having a 2° miscut which was prepared by a known desorption method.

DETAILED DESCRIPTION

The desorption method of this invention will be described as a method of preparing a silicon substrate prior to epitaxial growth by molecular beam epitaxy (MBE). However this method may be employed equally well in connection with other growth processes such as MOVCD, CVD, CBE and VPE, for example. Moreover, the desorption method described is effected on a (100) oriented surface of single-crystalline silicon oriented 3 degrees off-axis toward the [110] direction, as normally required for high quality GaAs growth on silicon. This surface is advantageously employed because it yields a high degree of bilayer step ordering, which has been shown to be necessary for the high quality epitaxial growth of GaAs on silicon surfaces. However, one of ordinary skill in the art will recognize that this method is equally applicable to any silicon surface upon which epitaxial growth is be performed.

Figure 1B:
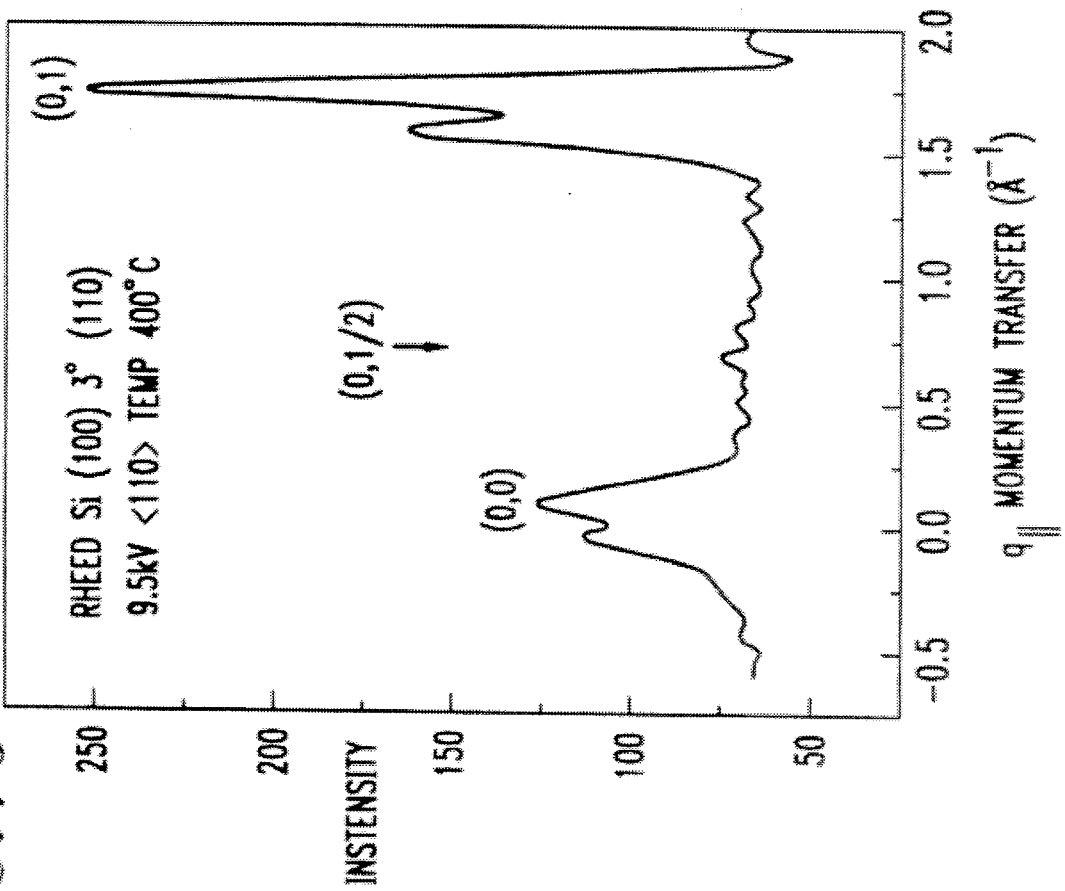
FIGS. 1(a) and 1(b) show a RHEED pattern and an intensity scan as a function of scattering momentum, respectively, from a high quality 3° miscut silicon substrate desorbed by a known method.
Figure 1A:
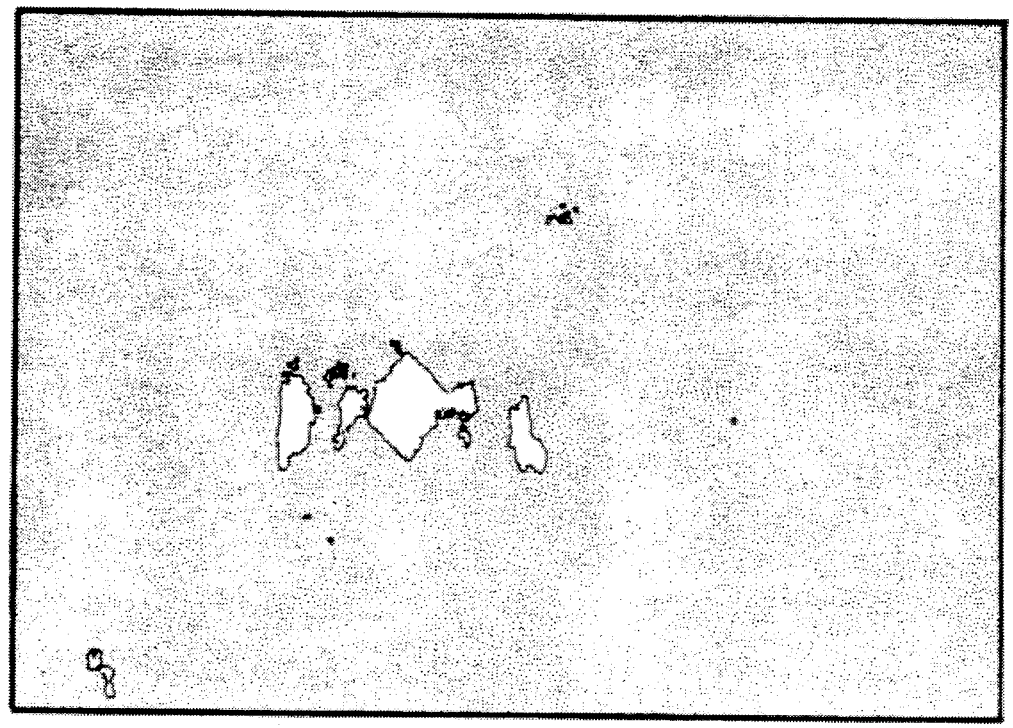

FIGS. 1(a) and 1(b) show, respectively, a RHEED pattern and an intensity scan of a silicon surface that has been cleaned by a known desorption process in which the silicon is heated to approximately 900° C. As the following analysis makes clear, these surfaces exhibit the high degree of bilayer step ordering necessary for high quality GaAs heteroepitaxy. In FIG. 1(a) the incident electron beam made a Bragg angle of 3.3° with the surface and the pattern was recorded at a temperature of 50° C. As the figures indicate, after oxide desorption of the on-axis silicon, (2×2) reconstructions were observed, indicating that the surface is double domained because single monolayer high steps form. In FIG. 1(a), where the incident beam is perpendicular to the step staircase, i.e. the <110> azimuth, two important aspects of the step distribution can be quantified. First, the ½ order reflection is weak in comparison to integral order reflections. As disclosed in R. Kaplan, *Surface Sci.* 93, 145 (1980), this effect is known to be caused by a single domained silicon surface in which most of the silicon dimers have the same alignment to the staircase. Additionally, integral order reflections occur as spots on an arc where reciprocal space surface rods intersect the Ewald sphere. Intensity from the surface rods is not observed. Accordingly, the surface disorder is low since low disorder is indicated by diffraction that manifests itself as spots on the Ewald sphere instead of as elongated rods. FIG. 1(a) also shows the splittings of each integral order reflection which are induced by the step staircase. Small azimuthal rotations reveal that the (0,0) reflection is split into five beams indicative of a highly ordered staircase with little to no meandering of the step edges (i.e., no kinks).

FIG. 1(b) is a scan of intensity versus scattering momentum taken parallel to the silicon surface (i.e., the shadow edge in FIG. 1a) through the (01) and (00) reflections for a beam directed along the <110> direction. FIG. 1(b) quantifies the step characteristics of the staircase at a temperature of 400° C. From the splittings the terrace width is estimated to be 48 Å, which is consistent with the 3 degree miscut angle of the silicon surface that is employed. The diffraction width of the spots are resolution limited and the staircase ledges are therefore kink free over distances greater than 400 Å. The complete absence of ½ order reflections in FIG. 1(b) differs from FIG. 1(a) and is not the result of the well known re-entrant transition that converts bilayer high steps to monolayer steps as the temperature is lowered. Rather, it arises from the formation of a dihydride-silicon phase caused by ambient $H_2$ condensation on silicon as the temperature is lowered. The hydride process transforms some bilayer high steps to multilayer high steps. Accordingly, this suggests that GaAs deposited on silicon by gas source MBE should begin at a temperature greater than 400° C. to avoid $H_2$ condensation.

Figure 1D:
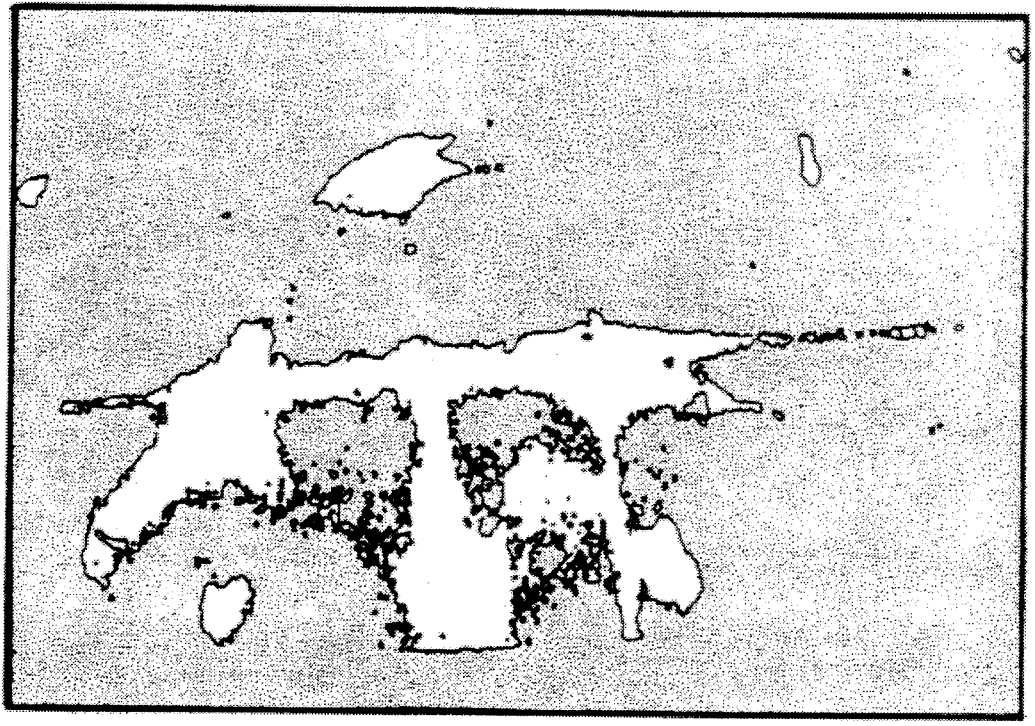
FIG. 1(d) shows a RHEED pattern of a silicon substrate prepared by the known method of direct atomic hydrogen etching.

FIG. 1(d) shows a silicon surface that has been prepared by the known method of direct ECR hydrogen plasma etching to remove the oxide layer. In contrast to FIGS. 1(a) and 1(b), this figure indicates that the silicon surface has faintly faceted. This occurs because bilayer step ordering does not have the lowest surface free energy for a miscut silicon (100) plane. Similar surface disorder accompanies oxide desorption when residual As and $N_2$ are present above $10^{-8}$ torr. Gallium arsenide deposited on these types of disordered surfaces produces poor heteroepitaxy.

FIG. 1(d) indicates that oxide desorption by direct atomic hydrogen etching causes considerable damage to the highly ordered silicon step staircase that is necessary for high quality epitaxial GaAs growth. Additional investigations by the inventors further reveal that all applications of direct ECR etching during the desorption process damage the staircase, with most applications producing faceting. It is believed that faceting occurs for the following reasons. First, a bilayer staircase is thermodynamically unstable with temperature upon hydrogen adsorption at the ledges. Moreover, atomic hydrogen plasma is known to etch miscut silicon anisotropically when silane forms. In addition, monohydride and dihydride formation passivates silicon dangling bonds that would otherwise minimize surface free energy for the bilayer step configuration through the benefit of dimerization energy. Much like the other disordered surfaces previously described, the surfaces desorbed by a direct ECR process lead to poor GaAs heteroepitaxy.

To avoid the surface damage caused by direct ECR etching of the silicon surface, this invention avoids the complete removal of the oxide layer by the plasma etchant. Rather, this invention implants particles such as atomic hydrogen into the oxide surface of the silicon substrate. After the implantation step, oxide desorption is effected by heating the silicon substrate to an elevated temperature that is less than the temperature required to clean the surface by thermal desorption alone (i.e., a temperature less than 825° C). This reduced temperature is believed sufficient to effectuate the removal of the oxide layer for the following reason. The oxide layer which forms on the silicon surface has an amorphous structure with many dangling bonds. The implantation step passivates the broken bonds and as a result the hydrogenated oxide layer bonds less efficiently to the silicon. Accordingly, the hydrogenated oxide layer can be desorbed at a temperature lower than that required to desorb an oxide layer that has not undergone an implantation step.

Figure 2:
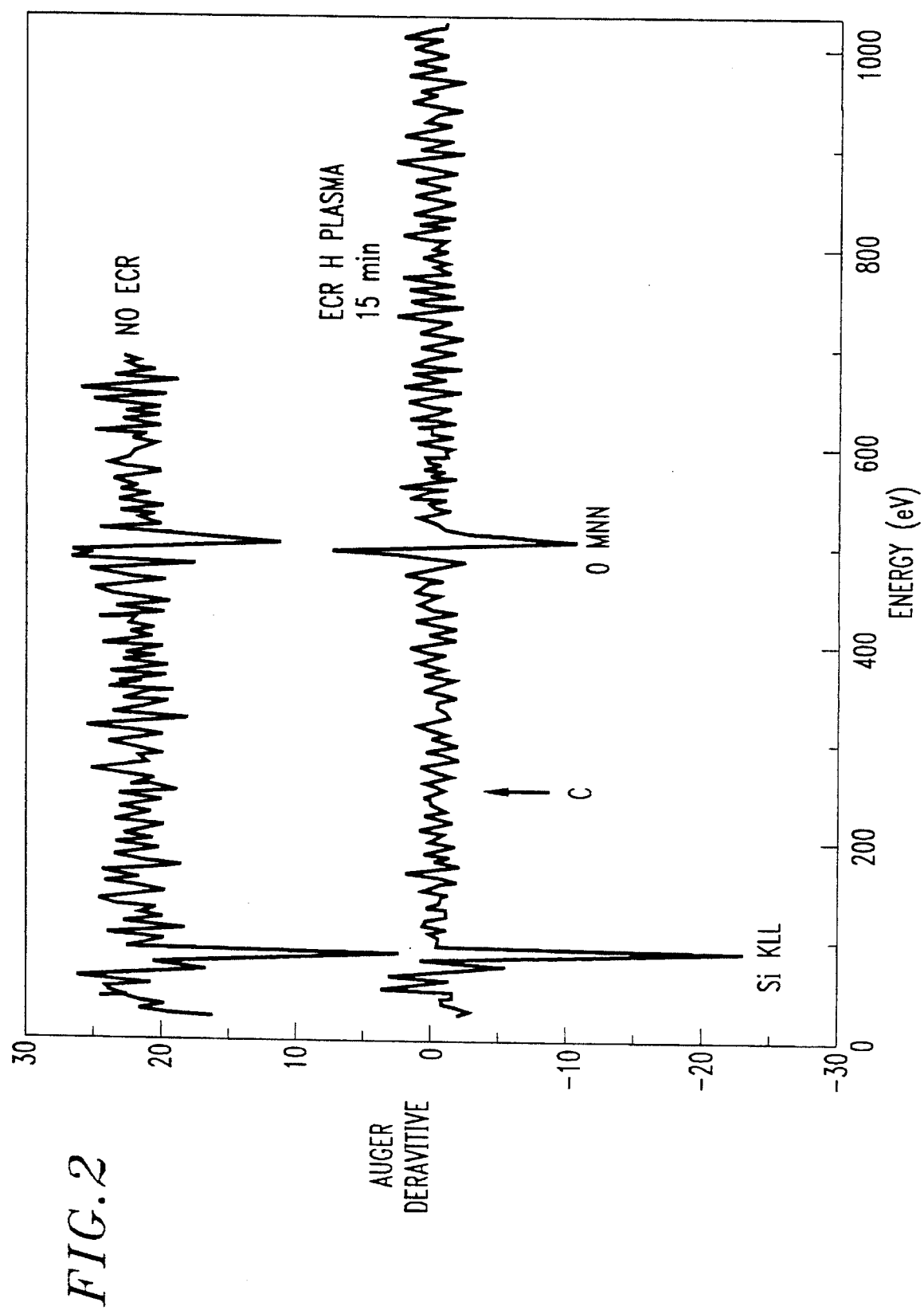
FIG. 2 shows Auger spectra before and after exposing a silicon substrate to hydrogen plasma from an ECR source for 15 minutes at a temperature of 300° C.

In this invention the beam of atomic hydrogen is applied to the oxide surface so that implantation occurs without the complete removal of the oxide layer. FIG. 2 shows Auger spectra before and after the silicon oxide surface is exposed to atomic hydrogen generated by a ECR source for 15 minutes at a temperature of 300° C. A comparison of both spectra reveals that the oxide layer is still present even after the atomic hydrogen exposure. In fact, significant oxide removal does not commence until after approximately 60 minutes of exposure. Even after 90 minutes of exposure faint traces of oxide remain. It has been determined that atomic hydrogen may be applied for up to approximately 90 minutes at a temperature of about 400° C. without completely removing the oxide.

After the implantation step has been performed, the sample is heated to desorb the oxide. For the sample employed in connection with FIG. 2, desorption was found to occur at 730° C., which is 100° C. lower than required for samples that did not undergo implantation.

Figure 1C:
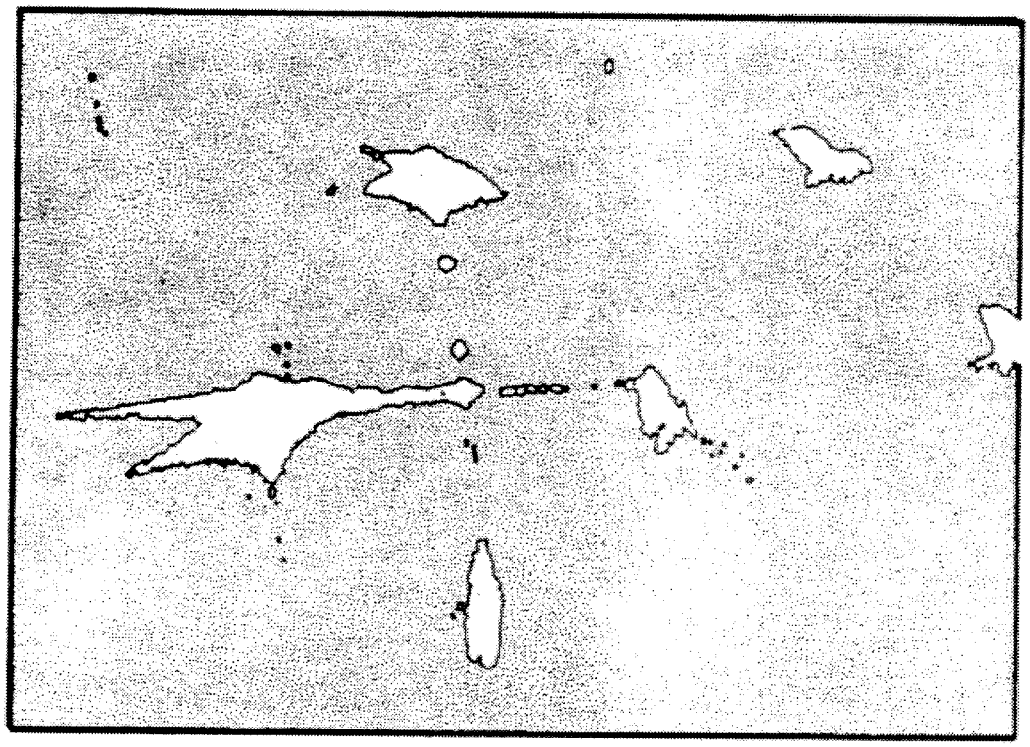
FIG. 1 (c) shows a RHEED pattern of a 3° miscut silicon substrate prepared in accordance with this invention.

FIG. 1(c) shows a RHEED pattern of a silicon surface prepared in accordance with the method of this invention. The incident beam was along a <420> azimuth and produced two superlattice spots of the staircase between the (004) and (008) Kikuchi line features of bulk silicon. While this azimuth provides information on step height and terrace width, it is also highly sensitive to many types of surface disorder. The positions of the satellite spots observed in FIG. 1(c) demonstrate that bilayer high steps comprise most of the staircase structure. The bilayer step ordering of the resulting desorbed silicon surface showed spot splittings nearly comparable in quality to those shown in FIGS. 1(a) and 1(c) which were desorbed at high temperature. Moreover, the inventors have demonstrated that GaAs heteroepitaxy can be successfully performed on these surfaces. An example of a GaAs device fabricated on a silicon surface desorbed by the method of this invention will be presented below.

The devices described below were fabricated in an MBE system composed of two separate chambers so that the substrate preparation method could be performed separately from the epitaxial growth process to avoid contamination by the III-V elements during desorption. The desorption chamber was cooled with liquid $N_2$ surrounding a high temperature substrate heater. The chamber incorporated a RHEED apparatus consisting of a 10 CV electron gun, a phosphor screen, CD camera and a frame grabber card for image processing. An ECR source was attached to the desorption chamber and connected to six nines pure hydrogen gas which was further purified by several additional methods.

Hydrogen was admitted into the desorption chamber via a gas manifold operated under mass flow feedback-control. The ECR source was operated in a cylindrical TE mode of a cavity surrounded with rare earth magnets. The source had excitation grids capable of 700 V ion acceleration. Under typical conditions the ECR hydrogen plasma was operated with an input of 3 standard cubic centimeters per minute of $H_2$ and a power of 180/1 (forward/reflected) watts, which produced 12 mA output current at 70 V under a vacuum of $2\times10^{-4}$ torr. The load lock was equipped with Auger spectroscopy via a cylindrical mirror analyzer to determine surface contamination levels.

To illustrate the quality of the substrates produced by the method of this invention, multiple quantum well (MQW) modulators were fabricated on a variety of silicon surfaces. The performance characteristics of such modulators are very sensitive to the quality of the substrate surface. Performance was measured in terms of the modulators' excitonic quality and quantum confined stark effect (QCSE) characteristics by employing photocurrent spectroscopy.

Figure 3A:
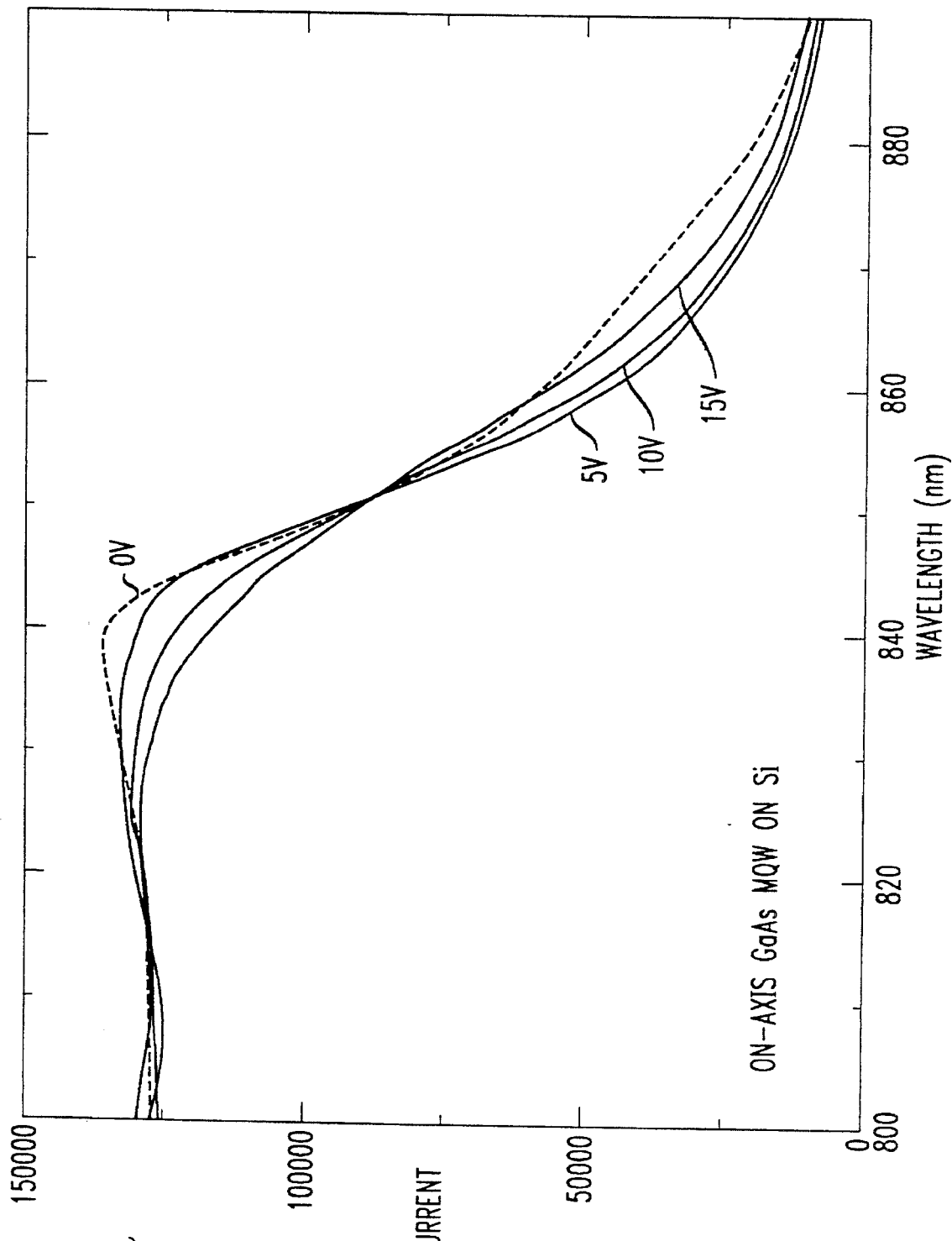

FIG. 3(a) show spectra taken at room temperature from MQW modulators grown upon an on-axis (i.e., no tilt) silicon surface. Accordingly, this surface did not exhibit bilayer step ordering. The MQW structure consisted of 50 periods of AlGaAs/GaAs with a 95 Å quantum well width such as disclosed in K. W. Goossen et al., *IEEE Photonics Tech. Letts.* 7, 763 (1992). Each structure was grown at a temperature of 600° C. atop a 2–3 μm thick GaAs buffer layer deposited on silicon. FIG. 3(a) shows that there is little to no QCSE for this MQW modulator grown directly upon on-axis silicon. Rather, the edge broadens much like for bulk GaAs. No antiphase domains were detected in the RHEED pattern for this sample. Nevertheless, the position of the absorption edge is blue shifted relative to bulk GaAs because significant size quantization occurs. This is supported by TEM measurements which resolved chemical contrast from the barrier well of the MQW modulator. The full width at half maximum (FWHM) of the exciton for this modulator is 20 meV and therefore much wider than the 11 meV for bulk GaAs. It is therefore plausible that substantial internal fields from various defect sources occur for on-axis growth. Most defects appear to be stacking fault related. This example indicates that when the silicon surface upon which the modulator is grown does not exhibit bilayer step ordering the performance of the modulator is adversely effected.

FIG. 3(b) show spectra for a shallow (i.e., an aluminum mole fraction in the barrier of 0.025) MQW modulator grown on a silicon surface misoriented by 2 degrees. The silicon surface was desorbed by heating the substrate to about 900° C. in accordance with the known desorption method. Accordingly, this surface exhibits bilayer step ordering. In contrast to FIG. 3(a), the photocurrent dependence of this modulator exhibits QCSE under an applied field. In fact the quality of the QCSE for this modulator grown on silicon is comparable to those modulators grown directly on GaAs. At 0 V, the excitonic line width is 9 meV FWHM, which is identical to the best results obtained for the GaAs/AlGaAs system, as reported in K. W. Goossen et al., *Appl. Phys. Letts.* 57, 2582, (1990). These results are quite surprising since the low barriers can only weakly confine excitons and QCSE is easily destroyed by sample imperfection. This modulator, as well as one grown with an aluminum mole fraction in the barrier of 0.3, clearly demonstrates that MQW modulators grown on a properly prepared silicon surface can be substantially equal in quality to those grown directly on GaAs.

Figure 4:
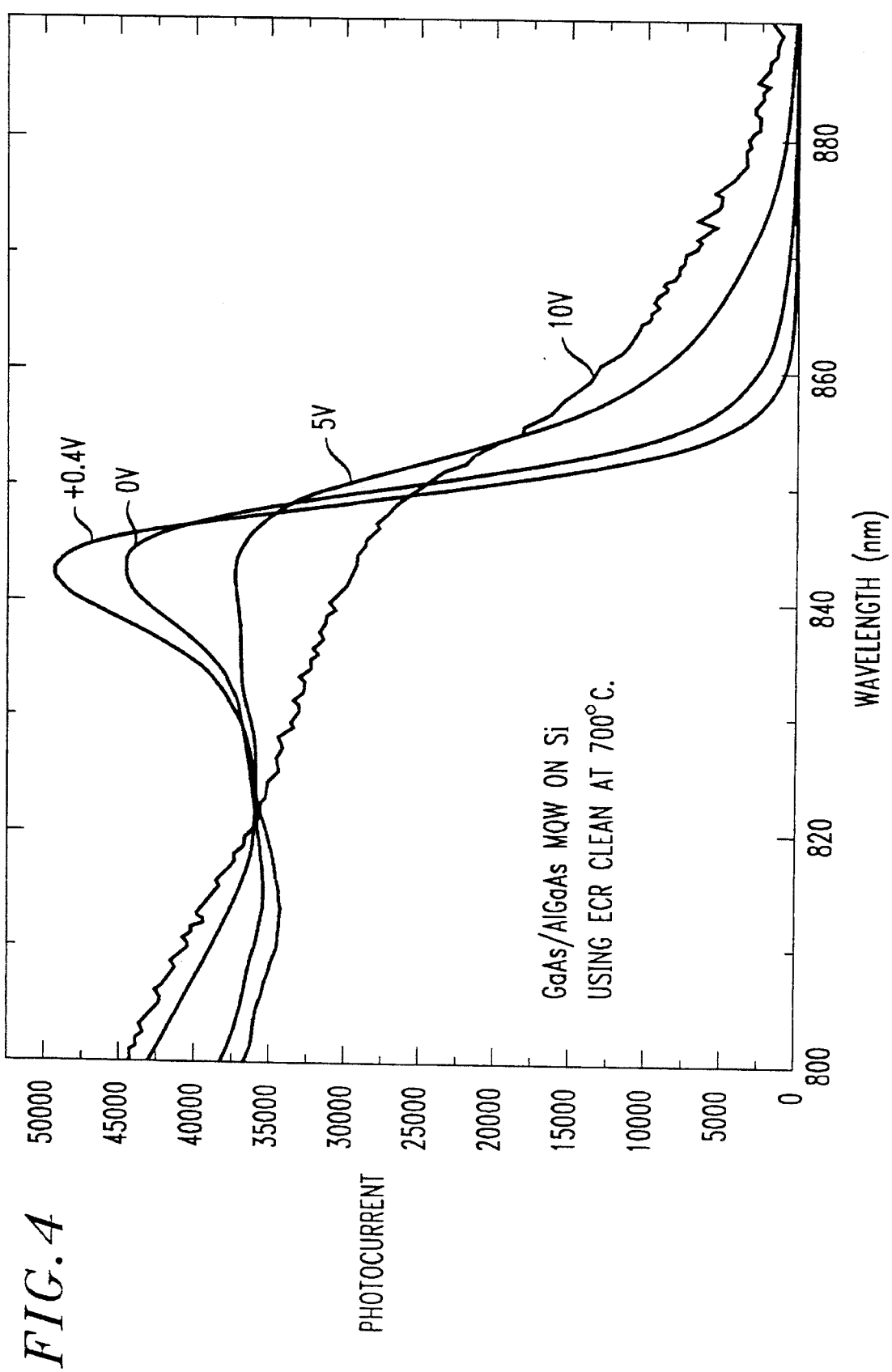
FIG. 4 shows the photocurrent as a function of wavelength for a MQW modulator grown on miscut silicon exposed to atomic hydrogen in accordance with this invention.

FIG. 4 shows spectra indicating the modulation performance of a MQW modulator grown upon off-axis silicon prepared in accordance with this invention. The exciton has a FWHM of 11 meV and is thus only slightly broader than for a MQW modulator grown on GaAs. While QCSE does occur in this sample, it is noticeably smaller (i.e., smaller shifts with applied fields). In addition, for fields above $10^5$ V/Cm, QCSE changes in character to exhibit bulk-like behavior. The origin of the 2 d to 3 d QCSE transition is most likely defect induced. Accordingly, this modulator demonstrates that a silicon substrate prepared in accordance with the present invention can yield structures comparable in quality to modulators such as shown in shown in FIG. 3(b) in which the silicon substrate is prepared in accordance with a known method..

The substrate preparation method of this invention has been described in terms of a ECR hydrogen implantation process performed on silicon prior to heteroepitaxial growth by MBE. However, the implantation process is not limited to ECR sources but rather may be performed by any means known in the art. Such methods include, for example, reactive ion etching, implantation, and sputtering. Moreover, the method of this invention is not limited to the implantation of hydrogen ions. More generally, other ions and neutral particles which are used in the semiconductor industry may be employed such as helium and the noble gases, for example, to weaken the bonds between the silicon and oxygen atoms forming the surface oxide layer. Other particles that may be employed include neutral hydrogen atoms and deuterium. Finally, as noted earlier, this preparation process may be used in connection with growth techniques other than MBE, including but not limited to MOVCD, CVD, CBE and VPE.

We claim:

1. A method of preparing a silicon substrate comprising the steps of:

implanting particles into an oxide layer on a silicon substrate; and then breaking bonds between silicon and oxygen atoms in the oxide layer by heating at a temperature below approximately 825° C. until the oxide layer has been substantially removed from the surface.

2. The method of claim 1 wherein the step of implanting particles comprises the step of implanting hydrogen ions.

3. The method of claim 1 wherein the step of implanting particles comprises the step of implanting particles selected from the group consisting of hydrogen ions, noble gas ions, hydrogen atoms, and deuterium.

4. The method of claim 2 wherein the hydrogen ions are implanted by electron cyclotron resonance.

5. The method of claim 1 wherein the step of breaking the bonds is performed with thermal energy.

6. A method of desorbing a silicon substrate comprising the steps of:

applying a particle flux to an oxide layer on a silicon substrate without completely removing the oxide layer; and then removing the oxide layer by heating the substrate to a temperature below approximately 825° C.

7. The method of claim 6 wherein the particle flux applied to the surface is a hydrogen ion flux.

8. The method of claim 7 wherein the hydrogen ion flux is applied by electron cyclotron resonance.

9. The method of claim 8 wherein the hydrogen ion flux is applied for a time period between 15 and 60 minutes.

10. A method of preparing a silicon substrate to serve as a substrate for epitaxial growth, said method comprising the steps of:

applying a particle flux to an oxide layer on the silicon substrate without completely removing the oxide layer; and then heating the surface to a temperature sufficient to desorb the oxide layer, said temperature being less than a temperature needed to thermally desorb the substrate without having applied a particle flux to the oxide.

11. The method of claim 10 wherein the step of applying a particle flux comprises the step of applying particles selected from the group consisting of hydrogen ions, noble gas ions, hydrogen atoms, and deuterium.

12. The method of claim 10 wherein the step of applying a particle flux comprises the step of applying particles selected from the group consisting of hydrogen ions, noble gas ions, hydrogen atoms, and deuterium.

13. The method of claim 1 wherein the silicon substrate is a (100) oriented silicon wafer oriented 3 degrees off axis toward the [100] direction.

14. The method of claim 4 wherein the silicon substrate is a (100) oriented silicon wafer oriented 3 degrees off axis toward the [100] direction.

15. The method of claim 6 wherein the silicon substrate is a (100) oriented silicon wafer oriented 3 degrees off axis toward the [100] direction.

16. The method of claim 12 wherein the silicon substrate is a (100) oriented silicon wafer oriented 3 degrees off axis toward the [100] direction.

* * * * *